(12) United States Patent
Jeon et al.

(10) Patent No.: US 10,312,359 B2
(45) Date of Patent: Jun. 4, 2019

(54) GUARD RINGS FOR CASCODE GALLIUM NITRIDE DEVICES

(71) Applicant: SEMICONDUCTOR COMPONENTS INDUSTRIES, LLC, Phoenix, AZ (US)

(72) Inventors: Woochul Jeon, Phoenix, AZ (US); Chun-Li Liu, Scottsdale, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/955,555

(22) Filed: Apr. 17, 2018

(65) Prior Publication Data
US 2018/0240900 A1    Aug. 23, 2018

Related U.S. Application Data

(62) Division of application No. 15/208,466, filed on Jul. 12, 2016, now Pat. No. 9,966,462.

(51) Int. Cl.
| | | |
|---|---|---|
| *H01L 29/778* | (2006.01) |
| *H01L 23/495* | (2006.01) |
| *H01L 27/088* | (2006.01) |
| *H01L 29/06* | (2006.01) |
| *H01L 29/16* | (2006.01) |
| *H01L 29/20* | (2006.01) |
| *H01L 29/40* | (2006.01) |
| *H01L 29/417* | (2006.01) |
| *H01L 29/423* | (2006.01) |
| *H01L 23/58* | (2006.01) |
| *H01L 29/10* | (2006.01) |

(52) U.S. Cl.
CPC ........ *H01L 29/778* (2013.01); *H01L 23/4952* (2013.01); *H01L 23/49537* (2013.01); *H01L 23/585* (2013.01); *H01L 27/0883* (2013.01); *H01L 29/0619* (2013.01); *H01L 29/0623* (2013.01); *H01L 29/16* (2013.01); *H01L 29/2003* (2013.01); *H01L 29/402* (2013.01); *H01L 29/41758* (2013.01); *H01L 29/42316* (2013.01); *H01L 29/1066* (2013.01)

(58) Field of Classification Search
CPC ............... H01L 29/778; H01L 29/2003; H01L 29/0619; H01L 29/0623; H01L 29/41758
See application file for complete search history.

(56) References Cited

U.S. PATENT DOCUMENTS

| | | |
|---|---|---|
| 9,165,999 B2 | 10/2015 | Ikeda |
| 2005/0202661 A1 | 9/2005 | Ceruzzi et al. |
| 2006/0131685 A1 | 6/2006 | Watanabe et al. |
| 2013/0126888 A1 | 5/2013 | Kizilyalli et al. |

*Primary Examiner* — Anthony Ho
(74) *Attorney, Agent, or Firm* — IPTechLaw

(57) ABSTRACT

Implementations of semiconductor devices may include: a plurality of drain fingers and a plurality of source fingers interdigitated with one another; at least one gate; and at gate bus formed to completely surround the plurality of drain fingers and the plurality of source fingers; wherein the gate bus is mechanically and electrically coupled to the at least one gate.

20 Claims, 4 Drawing Sheets

US 10,312,359 B2

GUARD RINGS FOR CASCODE GALLIUM NITRIDE DEVICES

CROSS REFERENCE TO RELATED APPLICATIONS

This application is a divisional application of the earlier U.S. Utility Patent Application to Woochul Jeon et al entitled "Guard Rings For Cascode Gallium Nitride Devices," application Ser. No. 15/208,466, filed Jul. 12, 2016, now pending, the disclosure of which is hereby incorporated entirely herein by reference.

BACKGROUND

1. Technical Field

Aspects of this document relate generally to guard rings to protect semiconductor devices. More specific implementations involve using guard rings in cascode devices.

2. Background

Gallium nitride (GaN) devices are used in high power/high frequency applications. These devices include source, drain, and gate regions where the source and drain regions are often arranged in an interdigitated fashion.

SUMMARY

Implementations of semiconductor devices may include: a plurality of drain fingers and a plurality of source fingers interdigitated with one another; at least one gate; and at gate bus formed to completely surround the plurality of drain fingers and the plurality of source fingers; wherein the gate bus is mechanically and electrically coupled to the at least one gate.

Implementations of semiconductor devices may include: a depletion mode (D-mode) transistor having one or more source fingers, one or more drain fingers and one or more gates; and a gate bus surrounding the one or more source fingers and the one or more drain fingers of the D-mode transistor; wherein the gate bus couples with the one or more gates of the D-mode transistor; wherein the gate bus is a first guard ring of the D-mode transistor.

Implementations of semiconductor devices may include one, all, or any of the following:

The D-mode transistor may be a gallium nitride (GaN) high electron mobility transistor (HEMT).

The gate bus may be formed from one selected from the group of an ohmic metal, a gate metal, and a field plate.

A channel under the first guard ring may be depleted during one of operation or non-operation of the device.

A channel under the first guard ring may be active during operation of the device.

The semiconductor device further includes at least one additional guard ring surrounding an outer perimeter of the first guard ring.

A channel between the first guard ring and the at least one additional guard ring may be active during operation of the device.

A second guard ring may be coupled to one of a group comprising the gate, the source and a substrate of the device.

A second guard ring may be floating relative to the drain fingers and the source fingers.

Implementations of semiconductor devices may include: a depletion mode (D-mode) transistor having one or more source fingers, one or more drain fingers and one or more gates; an enhanced mode (E-mode) transistor having one or more source pads, one or more drain pads and one or more gate pads; and a gate bus formed as a guard ring of the D-mode transistor; wherein the one or more gate pads of the D-mode transistor couple with the source pads of the E-mode transistor and an electrical ground.

Implementations of semiconductor devices may include one, all, or any of the following:

The D-mode transistor may be a gallium nitride (GaN) high electron mobility transistor (HEMT).

The E-mode transistor is a silicon (Si) field effect transistor (FET).

The semiconductor device further including a second guard ring surrounding an outer perimeter of the first guard ring.

The D-mode transistor is coupled to a first conductive lead frame and the E-mode transistor is coupled to a second conductive lead frame.

The semiconductor device further including a pin out from each of the drain of the D-mode transistor and the gate and the source of the E-mode transistor.

The source of the D-mode transistor may be coupled to the drain of the E-mode transistor.

The source of the D-mode transistor and the drain of the E-mode are coupled together through a wire bond.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended gallium nitride semiconductor device structure will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such gallium nitride semiconductor device structures and implementing components and methods, consistent with the intended operation and methods.

Examples of semiconductor devices having guard rings may be in found in U.S. Patent Publication No. 2013/0126888 to Kizilyalli et al., entitled "Edge Termination by Ion Implantation in GAN," published May 23, 2013, and filed Nov. 21, 2011 and U.S. Pat. No. 9,165,999 to Kentaro Ikeda, entitled "Nitride Semiconductor Device," issued Oct. 20, 2015 and filed Mar. 15, 2013, the disclosures of each which are hereby incorporated entirely herein by reference.

Figure 1:
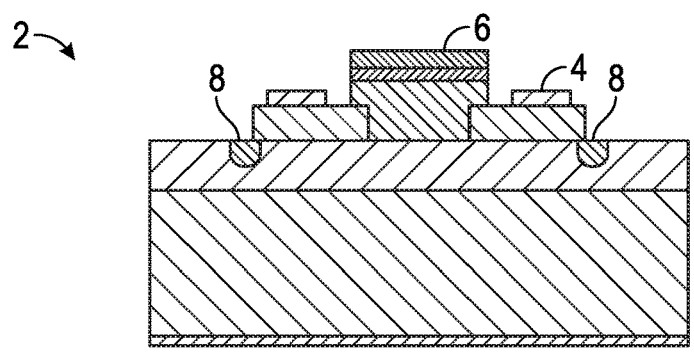
FIG. 1 is a cross-sectional view of a guard ring structure.

Referring to FIG. 1, a semiconductor device 2 having a guard ring structure is illustrated. This device has an elevated field region. The gate 4 structure and the source 6 structure of this device are located on positively and negatively doped regions of the device 2. The guard ring 8 is formed through ion implantation at the edge of the device to form a resistive layer.

Figure 2:
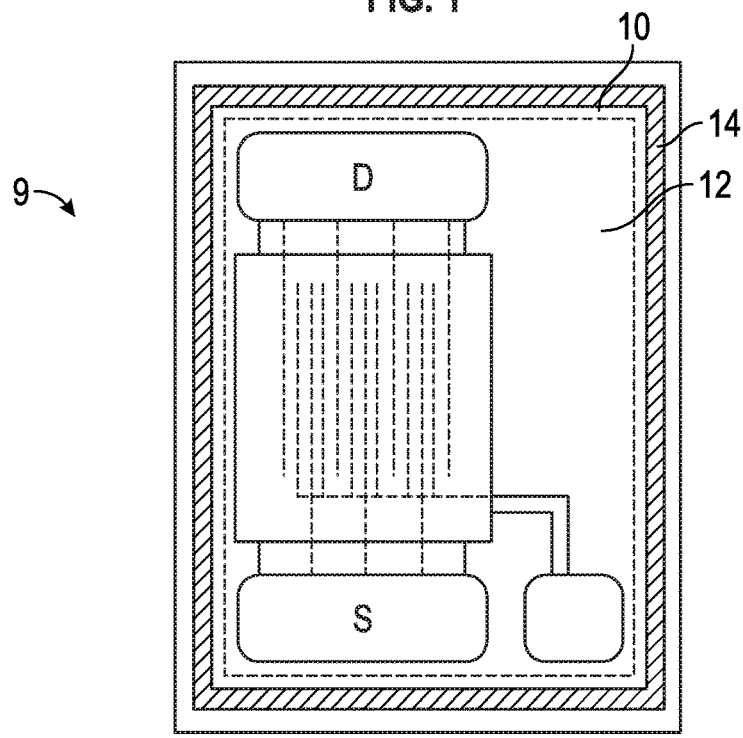
FIG. 2 is top view of another guard ring structure.

Referring to FIG. 2, another semiconductor device 9 having a guard ring structure is illustrated. This guard ring structure 10 is formed by a layer of isolation between the device region 12 and the guard ring 14, isolating the device from the two dimensional electron gas (2DEG).

Figure 3:
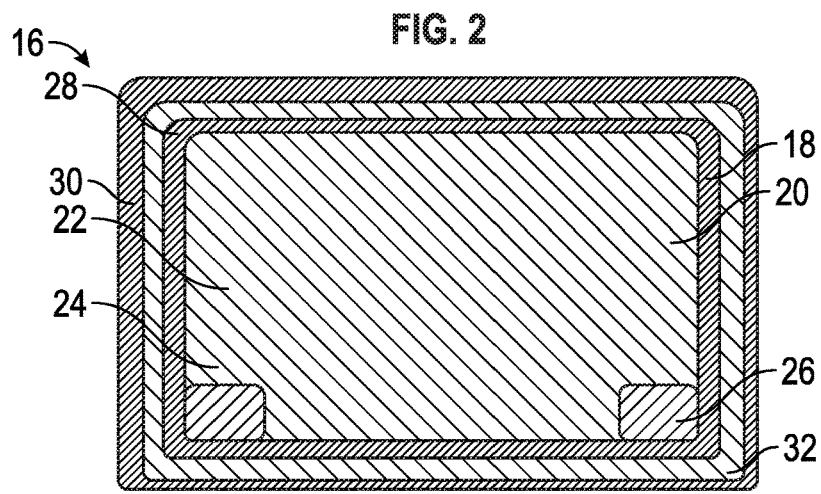
FIG. 3 is a top view of an implementation of a guard ring structure.

Referring now to FIG. 3, an implementation of a semiconductor device 16 having a guard ring structure is illustrated. A first guard ring 18 is formed around a device region 20. The device region 20 includes a plurality of drain fingers 22 and a plurality of source fingers 24 interdigitated with one another. In this implementation there are two gates 26, however, in other implementations, a single gate may be used. A gate bus 28 is mechanically and electrically coupled to the gates 26 and functions as a first guard ring 18. The first guard ring 18 completely surrounds the device region/die 20. The first guard ring 18 can be coupled to the substrate through ohmic/electrical contacts. The channel under the first guard ring 18 may be either depleted or an active 2DEG during the operation of the device. A second guard ring 30 is also illustrated. Multiple guard rings may be used in implementations of semiconductor devices having guard rings as described here. By non-limiting example, additional guard rings may be connected to the gate, the source, or the substrate of the device. The guard rings may also be floating guard rings, floating relative to the drain, source and gate of the device. The channel present between the guard rings 18 and 30 may be either depleted or an active 2DEG. The device may be a high electron mobility transistor (HEMT) formed from gallium nitride (GaN) or any other suitable semiconductor known in the art.

Figure 4A:
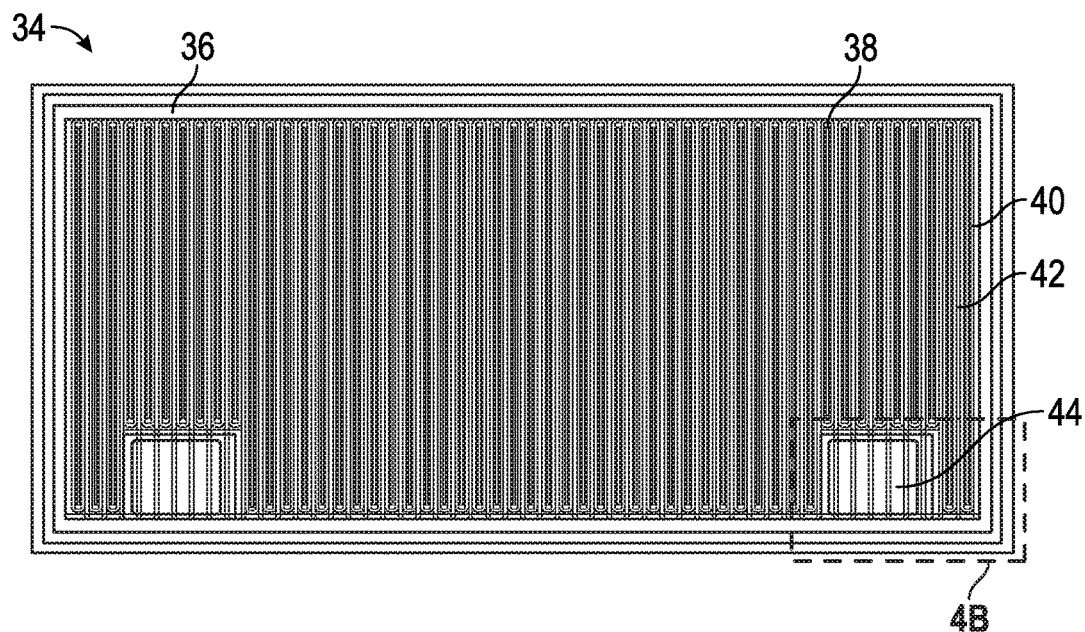
FIG. 4A is a top view of another implementation of a guard ring structure.
Figure 4B:
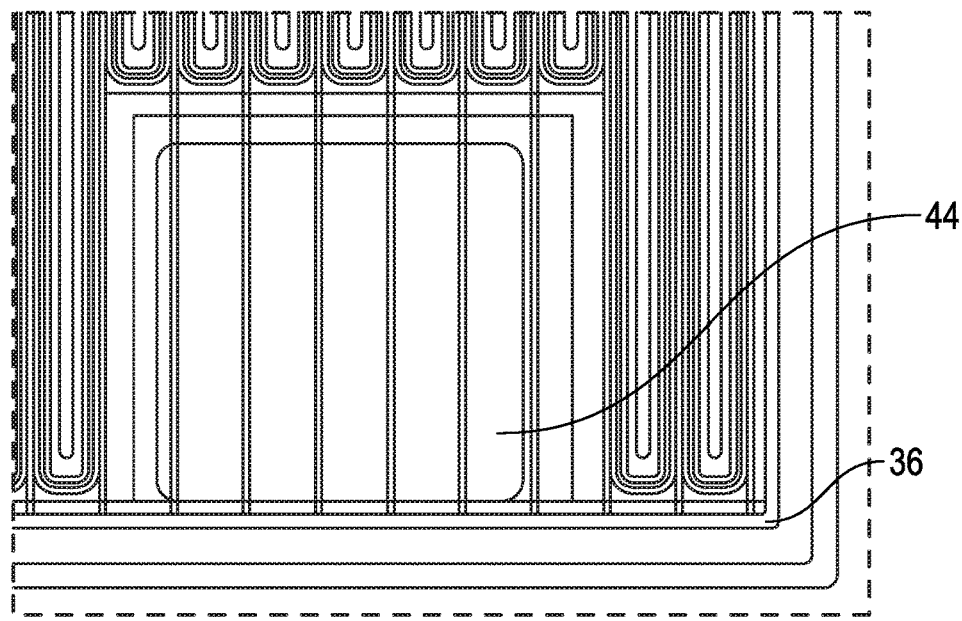
FIG. 4B is an enlarged view of a gate pad from FIG. 4A.

Referring now to FIG. 4A, another implementation of a semiconductor device 34 having guard rings 36 is illustrated. The device may be a depletion mode (D-mode) transistor 38 having one or more source fingers 40, one or more drain fingers 42 and one or more gates 44. A gate bus 36 surrounds the one or more source fingers and the one or more drain fingers. The gate bus 36 couples with the one or more gates 44 of the D-mode transistor. An enlarged view of the gate 44 and guard ring 36 is illustrated in FIG. 4B. The guard ring 36 is grounded through the gate 44 which may reduce the capacitance between the source and the substrate of the device.

Figure 5A:
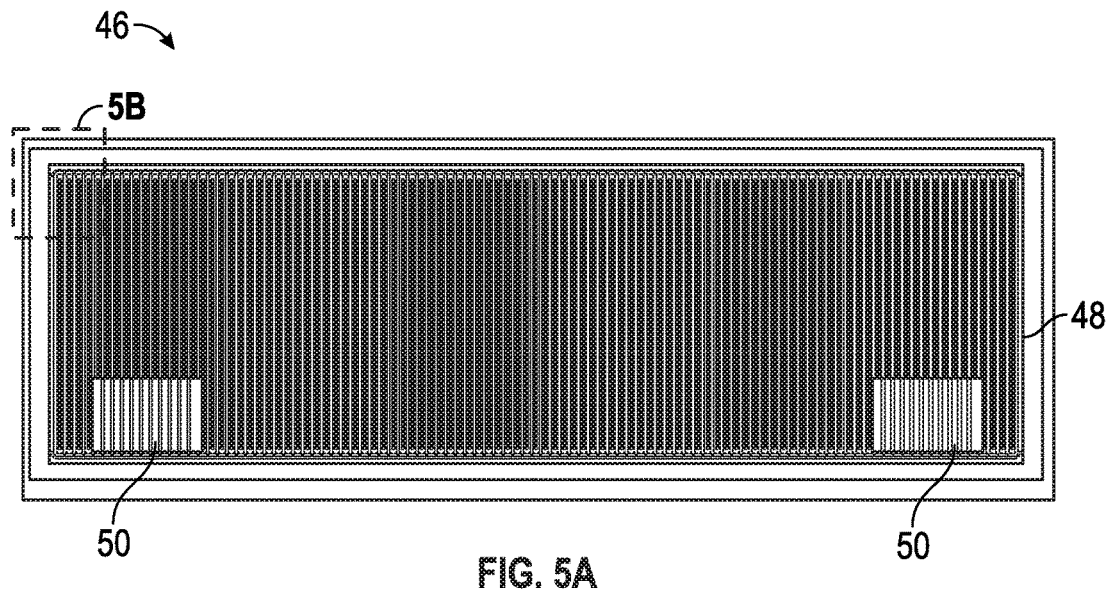
FIG. 5A is a top view of another implementation of a guard ring structure.
Figure 5B:
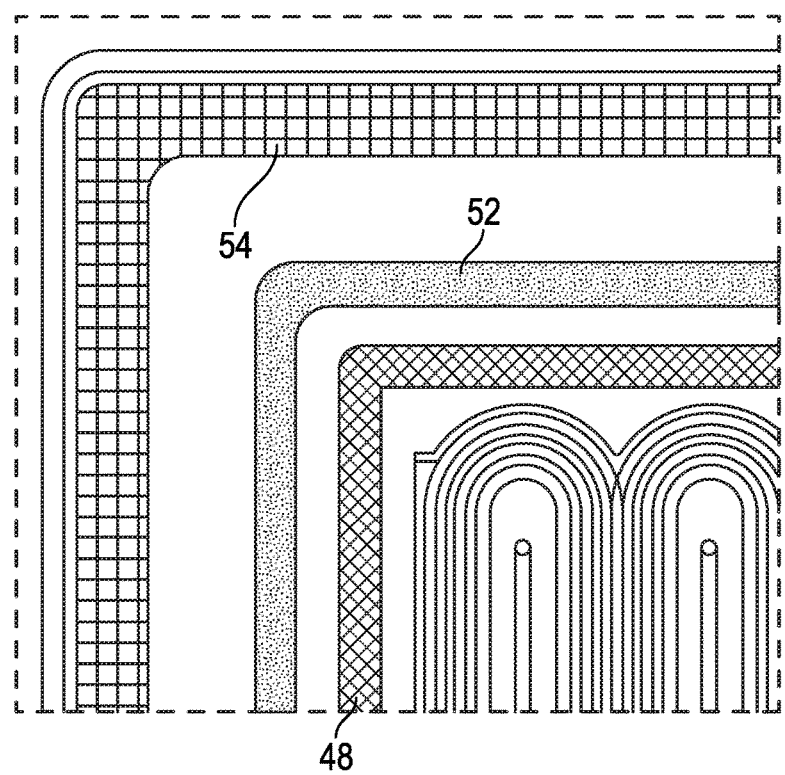
FIG. 5B is an enlarged view of a corner from the device in FIG. 5A.
Figure 6:
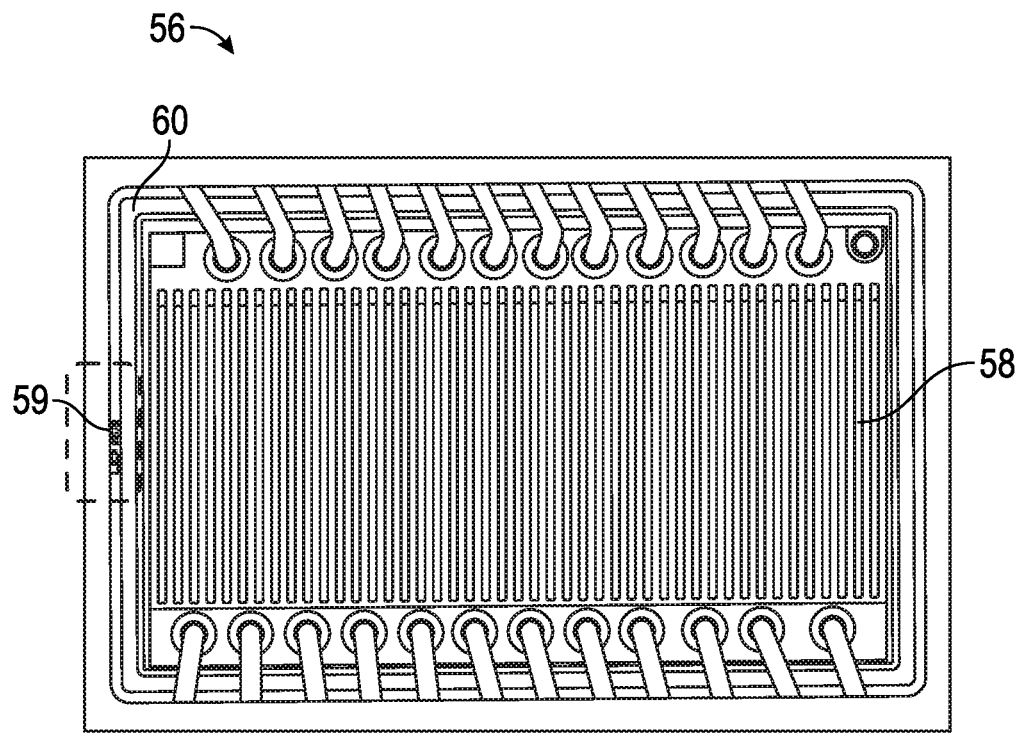
FIG. 6 is a view an implementation of a guard ring protecting a device.

Referring now to FIG. 5A, an implementation of a semiconductor device 46 having multiple guard rings is illustrated. An enlarged view of the corner of the device is illustrated in FIG. 5B. The gate bus acts as the first guard ring 48 and is coupled to the gates 50 of the device 46 as previously described in other implementations. In addition, a second 52 and third 54 guard ring are illustrated. The second 52 and third guard ring 54 may be coupled to the source and/or the substrate of the device. The layers used for the guard rings may be any suitable metal known in the art such as metals used for ohmic, gate, or field plate applications. Referring to FIG. 6, multiple guard rings may physically protect the device 56 as well. The gallium nitride epitaxial layer 58 can easily be damaged during sawing. Here, the second guard ring 60 blocked the transfer of a crack or chipping defect 59, occurring during sawing, into the device.

Figure 7:
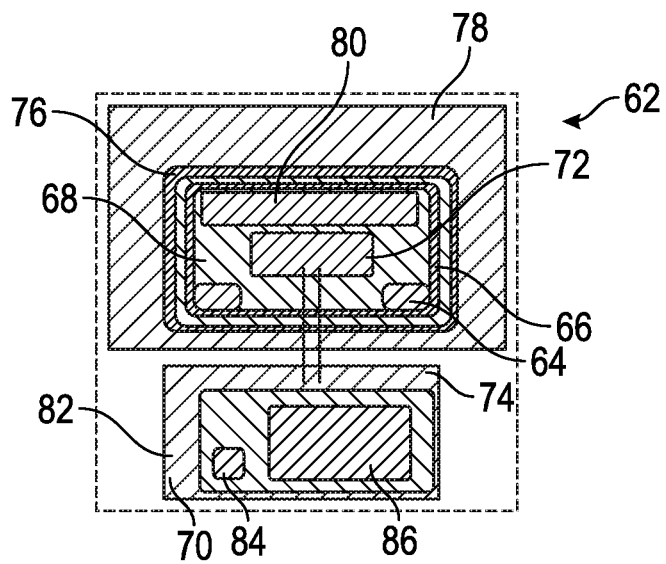
FIG. 7 is a top view of a cascode device using an implementation of a guard ring structure.

Referring now to FIG. 7, an implementation of a cascode device 62 having a gate 64 connected guard ring 66 is illustrated. A depletion mode (D-mode) transistor 68 is surrounded by a first guard ring 66 coupled to the gate 64. The D-mode transistor may be a GaN HEMT. A second guard ring 76 is surrounding an outer perimeter of the first guard ring 66. The D-mode transistor is coupled to a conductive lead frame 78 having leads coming out from the drain 80. More specifically, the lead frame 78 is connected to the gate pad 64, the drain pad 80 has a separate pin-out, and the gate and source of the silicon metal oxide semiconductor field effect transistor (Si-MOSFET) 86 are electrically connected. The D-mode transistor 68 is coupled to an enhancement mode (E-mode) transistor 70. The transistors may be coupled through wire bonds. The E-mode transistor may be a silicon (Si) field effect transistor (FET). The source 72 of the D-mode transistor is coupled to the substrate 74 of the E-mode transistor. The E-mode transistor 70 is coupled to a second conductive lead frame 82. The gate 84 and the source 86 of the E-mode transistor may have lead outs to connect to other devices. During operation of this implementation of a cascode device, the gate 64 of D-mode transistor 68 is connected to the ground. Having the gate 64 connected to the guard ring 66 may help to keep the potential at the guard ring constant (0V) and may effectively protect the device 62. The built-up charges between the source and the substrate can be significantly reduced.

Implementations of GaN devices like those disclosed herein may be manufactured by those of ordinary skill in the art using a wide variety of processing methods and techniques using the principles disclosed herein.

In places where the description above refers to particular implementations of gallium nitride semiconductor devices and implementing components, sub-components, methods and sub-methods, it should be readily apparent that a number of modifications may be made without departing from the spirit thereof and that these implementations, implementing components, sub-components, methods and sub-methods may be applied to other gallium nitride semiconductor devices.

What is claimed is:

1. A semiconductor device comprising:
    a depletion mode (D-mode) transistor comprising one or more source fingers, one or more drain fingers and one or more gates;
    an enhanced mode (E-mode) transistor comprising one or more source pads, one or more drain pads and one or more gate pads; and
    a gate bus formed as a guard ring of the D-mode transistor;
    wherein the gate bus is coupled with one or more gate pads of the D-mode transistor; and
    wherein the one or more gate pads of the D-mode transistor couple with the source pads of the E-mode transistor and an electrical ground.

2. The semiconductor device of claim 1, wherein the D-mode transistor is a gallium nitride (GaN) high electron mobility transistor (HEMT).

3. The semiconductor device of claim 1, wherein the E-mode transistor is a silicon (Si) field effect transistor (FET).

4. The semiconductor device of claim 1, further comprising a second guard ring surrounding an outer perimeter of the guard ring of the D-mode transistor.

5. The semiconductor device of claim 1, wherein the D-mode transistor is coupled to a first conductive lead frame and the E-mode transistor is coupled to a second conductive lead frame.

6. The semiconductor device of claim 1, further comprising a pin out from each of the drain of the D-mode transistor and the gate and the source of the E-mode transistor.

7. The semiconductor device of claim 1, wherein the source of the D-mode transistor is coupled to the drain of the E-mode transistor.

8. The semiconductor device of claim 1, wherein the source of the D-mode transistor and the drain of the E-mode transistor are coupled together through a wire bond.

9. A semiconductor device comprising:
   a depletion mode (D-mode) transistor comprising one or more source fingers, one or more drain fingers and one or more gates;
   an enhanced mode (E-mode) transistor comprising one or more source pads, one or more drain pads and one or more gate pads; and
   a gate bus formed as a guard ring of the D-mode transistor;
   wherein the gate bus is coupled with one or more gate pads of the D-mode transistor; and
   wherein the one or more gate pads of the D-mode transistor couple with the source pads of the E-mode transistor and an electrical ground; and
   wherein the source is not grounded.

10. The semiconductor device of claim 9, wherein the D-mode transistor is a gallium nitride (GaN) high electron mobility transistor (HEMT).

11. The semiconductor device of claim 9, wherein the E-mode transistor is a silicon (Si) field effect transistor (FET).

12. The semiconductor device of claim 9, further comprising a second guard ring surrounding an outer perimeter of the guard ring of the D-mode transistor.

13. The semiconductor device of claim 9, wherein the D-mode transistor is coupled to a first conductive lead frame and the E-mode transistor is coupled to a second conductive lead frame.

14. The semiconductor device of claim 9, further comprising a pin out from each of the drain of the D-mode transistor and the gate and the source of the E-mode transistor.

15. The semiconductor device of claim 9, wherein the source of the D-mode transistor is coupled to the drain of the E-mode transistor.

16. The semiconductor device of claim 9, wherein the source of the D-mode transistor and the drain of the E-mode transistor are coupled together through a wire bond.

17. A semiconductor device comprising:
   a depletion mode (D-mode) transistor comprising one or more source fingers, one or more drain fingers and one or more gates;
   an enhanced mode (E-mode) transistor comprising one or more source pads, one or more drain pads and one or more gate pads; and
   a gate bus formed as a guard ring of the D-mode transistor;
   a second guard ring surrounding an outer perimeter of the first guard ring;
   wherein the gate bus is coupled with one or more gate pads of the D-mode transistor; and
   wherein the one or more gate pads of the D-mode transistor couple with the source pads of the E-mode transistor and an electrical ground.

18. The semiconductor device of claim 17, wherein a channel between the gate bus and the second guard ring is depleted.

19. The semiconductor device of claim 17, wherein a channel between the gate bus and the second guard ring is active.

20. The semiconductor device of claim 17, wherein the D-mode transistor is coupled to a first conductive lead frame and the E-mode transistor is coupled to a second conductive lead frame.

* * * * *